United States Patent [19]

Van Tran

[11] Patent Number: 5,399,920
[45] Date of Patent: Mar. 21, 1995

[54] CMOS DRIVER WHICH USES A HIGHER VOLTAGE TO COMPENSATE FOR THRESHOLD LOSS OF THE PULL-UP NFET

[75] Inventor: Hiep Van Tran, Carrollton, Tex.

[73] Assignee: Texas Instruments Incorporated, Dallas, Tex.

[21] Appl. No.: 149,576

[22] Filed: Nov. 9, 1993

[51] Int. Cl.$^6$ ........................................ H03K 19/0948
[52] U.S. Cl. ............................. 326/83; 365/189.05;
326/119; 326/21; 327/333; 327/546
[58] Field of Search ............... 307/451, 443, 475, 579,
307/264, 296.5; 365/189.05

[56] References Cited

U.S. PATENT DOCUMENTS

| | | | |
|---|---|---|---|
| 4,695,744 | 9/1987 | Giordano | 307/475 |
| 4,906,056 | 3/1990 | Taniguchi | 307/264 |
| 4,920,284 | 4/1990 | Denda | 307/264 |
| 5,113,087 | 5/1992 | Ueno | 307/443 |
| 5,128,560 | 7/1992 | Chern et al. | 307/443 |
| 5,179,299 | 1/1993 | Tipon | 307/451 |
| 5,255,222 | 10/1993 | Eaton, Jr. | 365/189.05 |

OTHER PUBLICATIONS

IEEE 1993 *Custom Integrated Circuits Conference,* "An Adjustable Output Driver With Self-Recovering V$_{pp}$ Generator For 4M×16 DRAM" by K. Furutani, H. Miyamoto, Y. Morooka, M. Suwa and H. Ozaki, pp. 25.3.1–25.3.4.

IEEE, 1992 *1992 Symposium on VLSI Circuits Digest of Technical Papers,* "Application of a High-Voltage Pumped Supply For Low-Power DRAM" by R. C. Foss, G. Allan, P. Gillingham, F. Larochelle, V. Lines, G. Shimokura, pp. 106–107.

*Primary Examiner*—Edward P. Westin
*Assistant Examiner*—Benjamin D. Driscoll
*Attorney, Agent, or Firm*—Jacqueline J. Garner; Richard L. Donaldson; William E. Hiller

[57] ABSTRACT

The low-power two-stage data output buffer (20,70) includes a two-stage switching circuit (50, 72) that drives an n-channel pull-up transistor (24) in two stages, thus only using current from the pumped high voltage supply during the second stage of the operation. The two-stage switching circuit (50, 72) first drives the pull-up transistor (24) with the supply voltage, V$_{DD}$, then drives it with the pumped high voltage supply, V$_{PP}$. A feedback circuit, coupled between the output node (28) and the two-stage switching circuit (50, 72), generates a path from the high voltage supply, V$_{PP}$, to the n-channel pull-up transistor (24) in response to the supply voltage level appearing on the output node (28), and blocks the path from the high voltage supply, V$_{PP}$, to the supply voltage.

16 Claims, 2 Drawing Sheets

5,399,920

CMOS DRIVER WHICH USES A HIGHER VOLTAGE TO COMPENSATE FOR THRESHOLD LOSS OF THE PULL-UP NFET

TECHNICAL FIELD OF THE INVENTION

This invention relates in general to the field of integrated circuits. More particularly, the present invention relates to a low-power switching output buffer.

BACKGROUND OF THE INVENTION

In integrated circuits manufactured with negative substrate biased technology, p-channel devices or MOSFETS are not used to drive data onto output pins. N-channel devices are used for both pull-up and pull-down in the output buffer to prevent the possibility of direct current injection from the output pins to the substrate through the parasitic pnp bipolar junctions of the p-channel transistors. The use of n-channel devices in the output drivers is also advantageous for eliminating the problems of tub-biasing for p-channel pull-up and the hazards of bootstrap circuits.

When an n-channel transistor is used as a pull-up device to drive the output pin, its output can be pulled up to a voltage level that is one threshold voltage level, $V_T$, less than the supply voltage, $V_{DD}$. In applications where the supply voltage, $V_{DD}$, is five volts, the output high voltage level, $V_{OH}$, can usually attain adequate TTL output level with no difficulty. However, in applications where the supply Voltage $V_{DD}$ is below five volts or 3.3 volts, for example, the one threshold voltage drop becomes significant, and the resulting output high voltage may be well below acceptable TTL I/O levels.

In particular, in certain 64 Mb dynamic random access memory (DRAM) applications, the supply voltage, $V_{DD}$, is 3.3 volts. Referring to FIG. 1, in these DRAM applications, the gate of the n-channel pull-up MOSFET 10 in each output buffer 12 is switched by a high-voltage switching circuitry 14 coupled to a high-voltage pumped supply, $V_{PP}$, to be able to attain acceptable high TTL threshold level at the output. In contrast to the supply voltage, $V_{DD}$, the high-voltage supply, $V_{PP}$, is a limited reservoir of charge generated on-chip. Because each DRAM contains multiple output buffers, and each output buffer draws substantial current from the high-voltage pump as it switches to drive the output pins, the total current drain on the high-voltage pump is significant.

For example, each buffer switching an n-channel pull-up transistor with a 500 μm gate draws an estimated 0.54 mA for a 64 Mb DRAM operating at 20 MHz with $V_{PP}$ at 5.0 volts. For a DRAM with eight output buffers, the total $V_{PP}$ current draw is 4.32 mA; for a DRAM with sixteen output buffers, the total is 8.64 mA; and for a DRAM with thirty-two output buffers, the total $V_{PP}$ current requirement becomes 17.28 mA. As the number of output buffers doubles and quadruples, the requisite $V_{PP}$ pump becomes prohibitively large and noisy to operate. Therefore, increasing the pump capacity and size are not feasible solutions to an increasing $V_{PP}$ current demand.

Accordingly, a need has arisen for an output buffer that is able to drive an n-channel MOSFET to acceptable TTL output high voltage levels with substantial low power consumption.

SUMMARY OF THE INVENTION

In accordance with the present invention, a low-power output buffer is provided which substantially eliminates or reduces disadvantages and problems associated with prior circuit configurations.

In one aspect of the present invention, a low-power two-stage data output buffer includes a two-stage switching circuit that drives an n-channel pull-up transistor in two stages, thus only using current from the pumped high voltage supply during the second stage of the operation. The two-stage switching circuit first drives the pull-up transistor with the supply voltage, $V_{DD}$, then drives it with the pumped high voltage supply, $V_{PP}$.

In another aspect of the present invention, a feedback circuit, coupled between the output node of the output buffer and the two-stage switching circuit, generates a path from the high voltage supply, $V_{PP}$, to the n-channel pull-up transistor in response to the supply voltage level appearing on the output node, and blocks the path from the high voltage supply, $V_{PP}$, to the supply voltage.

In yet another aspect of the present invention, the feedback circuit further includes a threshold detector coupled to the output node, and a switching latch circuit, coupled between the threshold detector and the two-stage switching circuit. The switching latch circuit generates a path between the supply voltage, $V_{DD}$, and the n-channel pull-up device in response to the logic level at the output node being low, and maintains a path between the high voltage supply and the n-channel pull-up device in response to the output node having a voltage level near the high voltage level.

An important technical advantage of the present invention is the significantly reduced current drain from the pumped high voltage supply by the output buffers. The pumped high voltage supply is limited as it is generated on-chip from the supply voltage. In a DRAM with a large number of output buffers, such a reduction in power requirements is a must.

Another important technical advantage of the present invention is the ability to provide an acceptable TTL high output voltage at the output pin of the integrated circuit.

BRIEF DESCRIPTION OF THE DRAWINGS

For a better understanding of the present invention, reference may be made to the accompanying drawings, in which.

DETAILED DESCRIPTION OF THE INVENTION

Figure 1:
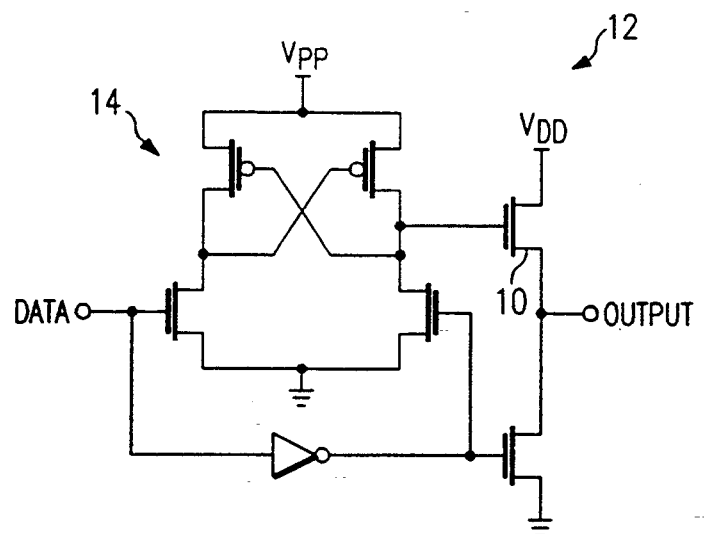
FIG. 1 is a simplified circuit schematic of an output buffer.
Figure 2:
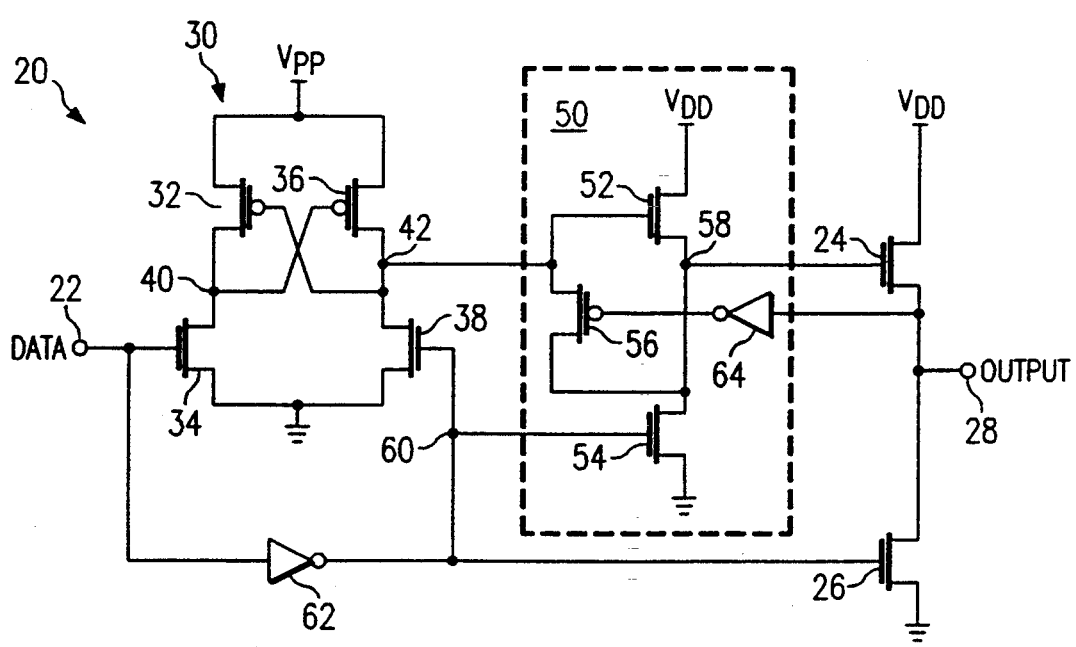
FIG. 2 is a simplified circuit schematic of a low-power two-stage output buffer.

With reference to the drawings, FIG. 2 illustrates an exemplary embodiment of a low-power two-stage switching output buffer, indicated generally at 20 and constructed according to the teaching of the present invention. Output buffer 20 may be employed in a DRAM integrated circuit fabricated with complementary MOS (CMOS) technology. Output buffer 20 is adapted for receiving an input logic level at a DATA node 22, and driving a pull-up n-channel transistor 24 and pull-down n-channel transistor 26 to generate a corresponding logic level on an OUTPUT node 28, which is connected to a pad and an output pin (not shown) of the integrated circuit. As shown in FIG. 2, pull-up and pull-down transistors 24 and 26 are coupled in series between the supply voltage, $V_{DD}$, and ground.

Coupled to DATA node 22 is a high-voltage switching circuit 30 which is connected to an internal high-voltage pumped supply, denoted by $V_{PP}$. The generation of the on-chip high-voltage supply is known in the art and is not described herein. High-voltage switching circuit 30 includes a p-channel device 32 and an n-channel device 34 coupled serially between $V_{PP}$ and ground, and another serially-coupled pair of p-channel device 36 and n-channel device 38 coupled in parallel with the first pair. The gates of p-channel devices 32 and 36 are cross-connected to nodes 40 and 42 located between serially coupled p-channel and n-channel devices 32, 34 and 36, 38, respectively, as shown.

Node 42 of high-voltage switching circuit 30 is further coupled to a two-stage switching circuit 50. Two-stage switching circuit 50 includes two serially connected n-channel transistors 52 and 54 coupled between the supply voltage, $V_{DD}$, and ground. A p-channel device 56 is coupled to the gate of device 52 and a node 58 between transistors 52 and 54. Node 42 of high-voltage switching circuit 30 is also coupled to the gate of n-channel device 52. An inverter 62, or an equivalent thereof, is coupled between DATA node 22, and the gate of n-channel pull-down transistor 26. The gates of n-channel transistors 38 and 54 are also coupled to the output of inverter 62, denoted by reference numeral 60.

The gate of p-channel device 56 of two-stage switching circuit 50 is controlled by the output of a threshold detector or an inverter 64, the input of which is coupled to OUTPUT node 28 of output buffer 20. Node 58 between n-channel devices 52 and 54 is coupled to the gate of n-channel pull-up transistor 24.

In operation, low-power two-stage switching output buffer 20 functions to pull up the OUTPUT node 28 in two stages. When a logic high is present at DATA node 22, n-channel MOSFET 34 is turned on to permit a logic low to pass from ground to node 40. The logic low on node 40 in turn turns on p-channel device 36, which passes a voltage level approximating the high-voltage level, $V_{PP}$, to node 42. N-channel transistor 52 is thus turned on by the logic high voltage on node 42, and passes a voltage level approximating $V_{PP}$ less one threshold voltage or $V_{DD}$, whichever is lower, to node 58. N-channel pull-up transistor 24 is thus turned on to pull OUTPUT node 28 to a voltage level approximately $V_{DD}-V_T$. Thus in the first stage of operation, OUTPUT node 28 is pulled up to a voltage near $V_{DD}-V_T$.

During the second stage of operation, the high at the OUTPUT node 28 is fed back through threshold detector or inverter 64 to turn on p-channel device 56, which passes the $V_{PP}$ voltage level from node 42 to node 58. The voltage level at OUTPUT node 28 is therefore pulled up from $V_{DD}-V_T$ to nearly $V_{PP}-V_T$ or $V_{DD}$, whichever is lower, which exceeds acceptable TTL output high voltage levels, $V_{OH}$.

Accordingly, the output voltage level of output buffer 20 is achieved in two stages. During the first stage, only the virtually unlimited supply voltage $V_{DD}$ is used to switch the output of the buffer to an intermediate voltage level. During the second stage of operations, the pumped voltage supply, $V_{PP}$, is used to switch the output of the buffer from the intermediate level to a sufficiently high output voltage level. Operating in this manner, the demand for $V_{PP}$ current to switch the output buffer is greatly reduced.

When the logic level at DATA node 22 is low, inverter 62 inverts the signal and the resultant logic high signal turns on both n-channel device 54 and n-channel pull-down transistor 26. The logic level at OUTPUT node 28 is therefore also low. It may be seen that $V_{PP}$ current draw is not a concern for output low situations.

Returning to the output high situation, when p-channel transistor 56 is turned on to permit $V_{PP}$ to appear at node 58, n-channel device 52 is also on. This forms a path through transistors 36, 56, and 52 between the $V_{PP}$ pumped supply to the $V_{DD}$ supply. Although not detrimental, the output buffer configuration may be improved by isolation techniques, one of which is shown in FIG. 3.

Figure 3:
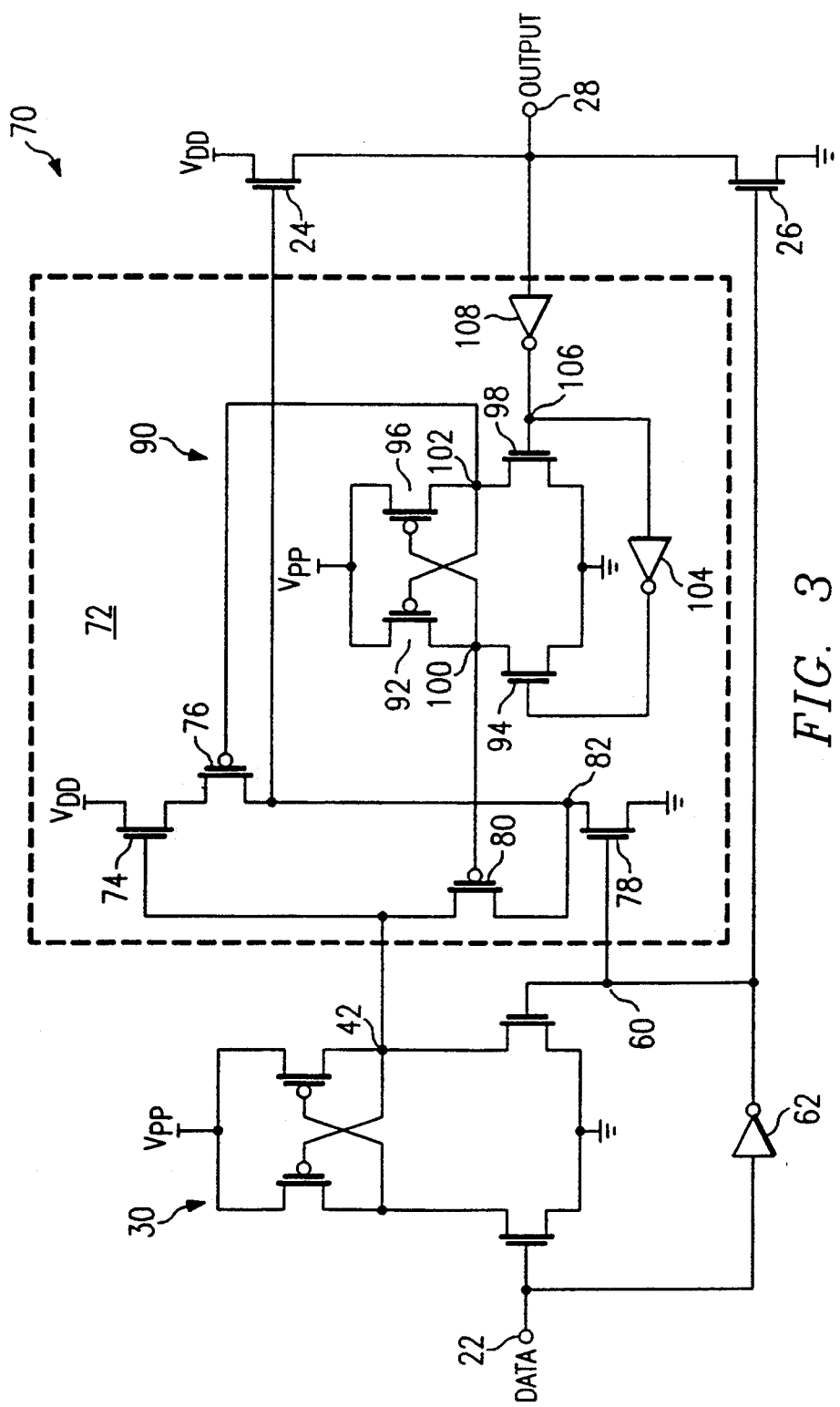
FIG. 3 is a simplified circuit schematic of a low-power two-stage output buffer with $V_{PP}$ to $V_{DD}$ isolation.

Referring to FIG. 3, the alternate embodiment 70 of the low-power two-stage output buffer with $V_{PP}$ to $V_{DD}$ isolation 72 is shown. In FIG. 3, similar reference numerals are used to refer to similar circuit nodes and configurations in FIG. 2. Node 42 of high-voltage switching circuit 30 is coupled to the gate of an n-channel device 74 of two-stage buffer with $V_{PP}$ to $V_{DD}$ isolation 72. The drain of n-channel device 74 is coupled to $V_{DD}$, and its source is coupled to a p-channel transistor 76 and another n-channel transistor 78, which are coupled in series to ground. The gate of transistor 78 is coupled to node 60 of high-voltage switching circuit 30. Another p-channel device 80 is coupled between the gate of transistor 74 and a node 82 on the drain of transistor 78. Node 82 is further coupled to the gate of n-channel pull-up transistor 24. Transistors 76 and 80 form part of a feedback circuit to block the path from $V_{PP}$ to $V_{DD}$.

A switching latch circuit implemented by another high-voltage switching circuit 90 is coupled to the gates of transistors 76 and 80. High-voltage switching circuit 90 includes serially connected p-channel and n-channel devices 92, 94 and 96, 98 coupled in parallel between $V_{PP}$ and ground. The gate of p-channel device 80 is coupled to a node 100 between p-channel and n-channel devices 92 and 94, and the gate of p-channel device 76 is coupled to a node 102 between p-channel and n-channel devices 96 and 98. An inverter 104 is coupled between the gate of transistor 98, denoted as node 106, and the gate of transistor 94. A threshold detector or an inverter 108 coupled between OUTPUT node 28 and node 106 functions as part of the feedback circuit.

In operation, when a logic one is present at DATA node 22, node 42 becomes high. Assuming the logic level at OUTPUT node 28 was high from the previous read operation, the logic high level passes through inverters 108 and 104 to turn n-channel transistor 94 on. Node 100 becomes low, and p-channel transistor 80 is turned on to permit the high voltage level at node 42 to pass to node 82, which is supplied to the gate of pull-up transistor 24 to keep OUTPUT node 28 near the high voltage level. It follows that since node 102 is high, p-channel transistor 76 remains "off," thus blocking a direct path from $V_{PP}$ to $V_{DD}$, or, more particularly, from node 42 through devices 80, 76 and 74 to $V_{DD}$.

If a logic one is present at DATA node 22, but the logic level of the previous read operation was low, transistor 76 would be turned on. The voltage level at OUTPUT node 28 is near $V_{DD}$ due to pull-up transistor 24 being turned on. In the feedback circuit, the logic high at OUTPUT node 28 in turn turns transistor 94 on, turns transistor 96 on, and turns transistor 76 off. At the same time, transistor 80 is turned on to permit the $V_{PP}$ voltage level to be propagated to OUTPUT node 28 without a direct path to the $V_{DD}$ supply.

When DATA node 22 is low, OUTPUT node 28 is pulled down by pull-down transistor 26 regardless of the previous output logic levels.

Constructed in this manner, the voltage level at the output of two-stage output buffer 20 and 70 is capable of reaching acceptable high voltage output levels with n-channel pull-up transistors. In addition, the amount of current required to switch the output is significantly reduced by using a two stage switching scheme. Output buffer 70 further provides $V_{PP}$ to $V_{DD}$ isolation or blocking circuit to avoid any direct path therebetween. The present invention is not limited to the DRAM environment and may be applicable to situations where low-power driving of output pins is desirable.

Although the present invention has been described in detail, it should be understood that various changes, substitutions and alterations can be made thereto without departing from the spirit and scope of the present invention as defined by the appended claims.

What is claimed is:

1. A data output buffer coupled to a high voltage supply and a supply voltage for driving an n-channel pull-up device coupled to an output node in response to a logic level on a data node, comprising:
   a two-stage switching circuit coupled to said high voltage supply and said supply voltage for supplying a supply voltage to said n-channel pull-up device in response to a logic one appearing on the data node; and
   a feedback circuit, coupled between the output node and said two-stage switching circuit, for generating a path from the high voltage supply to said n-channel pull-up device in response to the supply voltage level appearing on the output node.

2. The data output buffer, as set forth in claim 1, wherein said feedback circuit further comprises a circuit for blocking a path from the high voltage supply to the supply voltage in response to a voltage level approximating the supply voltage appearing at the output node.

3. The data output buffer, as set forth in claim 1, wherein said feedback circuit comprises:
   a threshold detector coupled to the output node; and
   a switching latch circuit, coupled between said threshold detector and said two-stage switching circuit, for generating a path between the supply voltage and said n-channel pull-up device in response to the logic level at the output node being low, and for coupling the high voltage supply to said n-channel pull-up device in response to the output node having a voltage level near the supply voltage.

4. The low-power output buffer, as set forth in claim 1, further comprising:
   an n-channel pull-down device coupled between the output node and ground; and
   an inverter coupled between the data node and the gate of said n-channel pull-down device.

5. The low-power output buffer, as set forth in claim 1, wherein said two-stage switching circuit comprises:
   a first n-channel device, its gate coupled to a first node, its drain coupled to the supply voltage, and its source coupled to the gate of the n-channel pull-up device; and
   a second n-channel device, its gate coupled to the data node so as to receive an inverse logic level of the logic level on the data node, its drain coupled to the source of said first n-channel device, and its source coupled to ground.

6. The low-power output buffer, as set forth in claim 5, wherein said feedback circuit comprises:
   a first switch, coupled between said first n-channel device and said n-channel pull-up device, being responsive to a logic zero appearing at the output node;
   a second switch, coupled between said first node and the gate of said n-channel pull-up device, being responsive to a logic one appearing at the output node; and
   a threshold detector coupled between the output node and said first and second switches.

7. The low-power output buffer, as set forth in claim 1, wherein said feedback circuit comprises:
   a switch coupled so as to couple the high voltage supply to the gate of said n-channel pull-up device; and
   a threshold detector coupled to the output node and supplying a control signal to said switch.

8. A low-power output buffer coupled to a high voltage supply and a supply voltage for driving an n-channel pull-up device coupled to an output node in response to the logic level on a data node, where the high voltage supply generates a high voltage greater than the supply voltage, the output buffer comprising:
   a high-voltage switching circuit receiving the logic level on the data node and for supplying the high voltage to a first node;
   a two-stage switching circuit coupled to said first node for driving said n-channel pull-up device and generating a voltage level approximating the supply voltage at the output node; and
   a feedback circuit, coupled between the output node and said two-stage switching circuit, for generating a path from said first node to said n-channel pull-up device, driving said n-channel pull-up device, and boosting the voltage level at the output node to approximately the supply voltage in response to the voltage level approximating the supply voltage less a threshold voltage appearing at the output node.

9. The low-power output buffer, as set forth in claim 8, said feedback circuit further comprises a circuit for blocking a path from the high voltage supply to the supply voltage in response to a voltage level approximating the supply voltage appearing at the output node.

10. The low-power output buffer, as set forth in claim 8, wherein said two-stage switching circuit comprises:
    a first n-channel device, its gate coupled to said first node, its drain coupled to the supply voltage, and its source coupled to the gate of the n-channel pull-up device; and
    a second n-channel device, its gate coupled to the data node so as to receive an inverse logic of the logic level on the data node, its drain coupled to the source of said first n-channel device, and its source coupled to ground.

11. The low-power output buffer, as set forth in claim 8, wherein said feedback circuit comprises:
    a p-channel device coupled between said first node and the gate of said n-channel pull-up device; and a threshold detector coupled between the output node and the gate of said p-channel device.

12. The low-power output buffer, as set forth in claim 8, wherein said feedback circuit comprises:
a threshold detector coupled to the output node; and
a switching latch circuit, coupled between said threshold detector and said two-stage switching circuit, for generating a path between the supply voltage and said n-channel pull-up device in response to said logic level at the output node being low, and for maintaining a path between said first node and said n-channel pull-up device in response to the output node having a voltage level near the supply voltage.

13. The low-power output buffer, as set forth in claim 8, further comprising:
an n-channel pull-down device coupled between the output node and ground; and
an inverter coupled between the data node and the gate of said n-channel pull-down device.

14. A low-power method for driving an n-channel pull-up output transistor in a data output buffer, comprising the steps of:
generating a first path from a supply voltage to the n-channel pull-up transistor and switching the output of the data output buffer to a first voltage;
generating a second path from a high voltage pumped supply to the n-channel pull-up transistor and switching the output of the data output buffer to a second voltage greater than said first voltage.

15. The method, as set forth in claim 14, further comprising the step of:
detecting the first voltage level at the output of the data output buffer; and
generating said second path in response to detecting the first voltage level.

16. The method, as set forth in claim 14, further comprising the steps of:
detecting the first voltage level at the output of the data output buffer; and
blocking said first path in response to detecting the first voltage level.

* * * * *